United States Patent
Gault et al.

(10) Patent No.: US 9,549,479 B2
(45) Date of Patent: Jan. 17, 2017

(54) FRICTION HINGE FOR TABLET COMPUTERS

(71) Applicant: Microsoft Corporation, Redmond, WA (US)

(72) Inventors: Joe Gault, Seattle, WA (US); Scott Bowers, Woodinville, WA (US); Brian Bitz, Redmond, WA (US); Aseem Singla, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/281,905

(22) Filed: May 20, 2014

(65) Prior Publication Data

US 2015/0342067 A1   Nov. 26, 2015

(51) Int. Cl.
| | | |
|---|---|---|
| A47G 29/00 | (2006.01) |
| H05K 5/02 | (2006.01) |
| H05K 5/00 | (2006.01) |
| G06F 1/16 | (2006.01) |

(52) U.S. Cl.
CPC ........... *H05K 5/0226* (2013.01); *G06F 1/1681* (2013.01); *H05K 5/0086* (2013.01); *H05K 5/0234* (2013.01); *Y10T 16/54035* (2015.01); *Y10T 16/54038* (2015.01)

(58) Field of Classification Search
CPC .. H05K 5/0226; H05K 5/0234; H05K 5/0086; G06F 1/1681; Y10T 16/54035; Y10T 16/54038
USPC  248/677, 688, 188.6, 188.8, 188.91; 13/374
See application file for complete search history.

(56) References Cited

U.S. PATENT DOCUMENTS

| | | | |
|---|---|---|---|
| 6,233,138 B1 | 5/2001 | Osgood | |
| 7,913,357 B2 * | 3/2011 | Peng et al. | 16/321 |
| 8,074,956 B2 * | 12/2011 | Wang et al. | 248/688 |
| 8,224,405 B2 | 7/2012 | Lombardi et al. | |
| 8,230,992 B2 | 7/2012 | Law et al. | |
| 8,267,368 B2 * | 9/2012 | Torii et al. | 248/677 |
| 8,514,568 B2 * | 8/2013 | Qiao et al. | 361/679.59 |
| 8,523,131 B2 * | 9/2013 | Derry et al. | 248/292.13 |
| 2006/0272128 A1 | 12/2006 | Rude et al. | |
| 2007/0164191 A1 * | 7/2007 | Kim | 248/686 |

(Continued)

FOREIGN PATENT DOCUMENTS

| | | |
|---|---|---|
| WO | 9845769 A1 | 10/1998 |
| WO | 2005064436 A1 | 7/2005 |

OTHER PUBLICATIONS

Daniel, "New Friction Hinge for iPad Flip Stands", Published on: Jun. 18, 2013, Available at: http://www.nclosures.com/new-friction-hinge-design/.

(Continued)

*Primary Examiner* — Gwendolyn Baxter
(74) *Attorney, Agent, or Firm* — Qudus Olaniran; Judy Yee; Micky Minhas

(57) ABSTRACT

Technologies are generally described for a kickstand or similar support device connection mechanism in conjunction with computing devices. A substantially constant gap may be maintained between the kickstand and the device enclosure across the hinge rotation spectrum allowing the hinge and/or the kickstand to be level with the device enclosure. The connection mechanism may support various usage loads and rotation angles up to about 180 degrees, as well as allow for low force opening to a first position.

18 Claims, 12 Drawing Sheets

(56) References Cited

U.S. PATENT DOCUMENTS

| | | |
|---|---|---|
| 2010/0072334 A1 | 3/2010 | Le Gette et al. |
| 2012/0176741 A1 | 7/2012 | Wu et al. |
| 2012/0215284 A1 | 8/2012 | Berg et al. |
| 2013/0100597 A1 | 4/2013 | Berg et al. |
| 2013/0229100 A1 | 9/2013 | Siddiqui et al. |
| 2014/0047672 A1 | 2/2014 | Saito et al. |
| 2014/0263939 A1* | 9/2014 | Rinner .................. 248/688 |

OTHER PUBLICATIONS

Kraus, Aaron, "HumanToolz Mobile Stand: A New iPad Kickstand on Kickstarter", Published on: Jul. 31, 2012, Available at: http://www.technologytell.com/apple/100699/humantoolz-mobile-stand-a-new-ipad-kickstand-on-kickstarter/.

Smith, Josh, "Quirky Cloak iPad Case Review", Published on: Feb. 3, 2011, Available at: http://notebooks.com/2011/02/03/quirky-cloak-ipad-case-review/.

"International Search Report & Written Opinion Issued in PCT Application No. PCT/US2015/031271", Mailed Date: Sep. 2, 2015, 10 Pages.

"Second Written Opinion Issued in PCT Application No. PCT/US2015/031271", Mailed Date: May 2, 2016, 5 Pages.

\* cited by examiner

FRICTION HINGE FOR TABLET COMPUTERS

DETAILED DESCRIPTION

With the proliferation of computing and networking technologies, smaller, portable, and wearable computing devices are becoming a mainstay of personal and professional use every day. Tablet computers, smartphones, and phablets are examples of devices that can be gripped in portrait or landscape orientation, or that may be placed on a desktop or other flat surface and viewed in portrait or landscape orientation without gripping the device. For example, the SURFACE® device by MICROSOFT CORP. of Redmond, Wash. is a tablet computer that can be used similar to a laptop computer with a connectable keyboard and an integrated kickstand. Users can set the device at an angle on a desk using the kickstand and type on the connected keyboard. Similar devices make use of kickstands to provide different angles of viewing for users when the tablet is not used in hand.

Kickstands and similar support mechanisms may enable a limited number of discrete screen angles. Offering discrete screen angles may limit the user experience. In addition, kickstands and similar support devices may be coupled to the tablet they support through a hinge.

According to exemplary kickstand implementations, a substantially constant gap may be maintained between the kickstand and the device enclosure across the hinge rotation spectrum allowing the hinge and/or the kickstand to be level with the device enclosure. The connection mechanism may support various usage loads and rotation angles up to about 180 degrees. According to other example implementations, the connection mechanism may allow for low force opening to a first position while accounting for accidental overloads and maintain the support behavior throughout a design lifecycle of a tablet computing device.

These and other features and advantages will be apparent from a reading of the following description and a review of the associated drawings. In the following description, references are made to the accompanying drawings that form a part hereof, and in which are shown by way of illustrations specific implementations or examples. These aspects may be combined, other aspects may be utilized, and structural changes may be made without departing from the spirit or scope of the present disclosure. The following description is therefore not to be taken in a limiting sense, and is not be taken as restricting aspects as claimed.

While some implementations will be described in the general context of tablet or similar form factor computing devices, aspects may also be implemented in combination with other devices and systems that may be supported by a kickstand or similar support device. For example, digital picture frames, televisions, and other devices that include a display may employ a kickstand as described herein.

Figure 1:
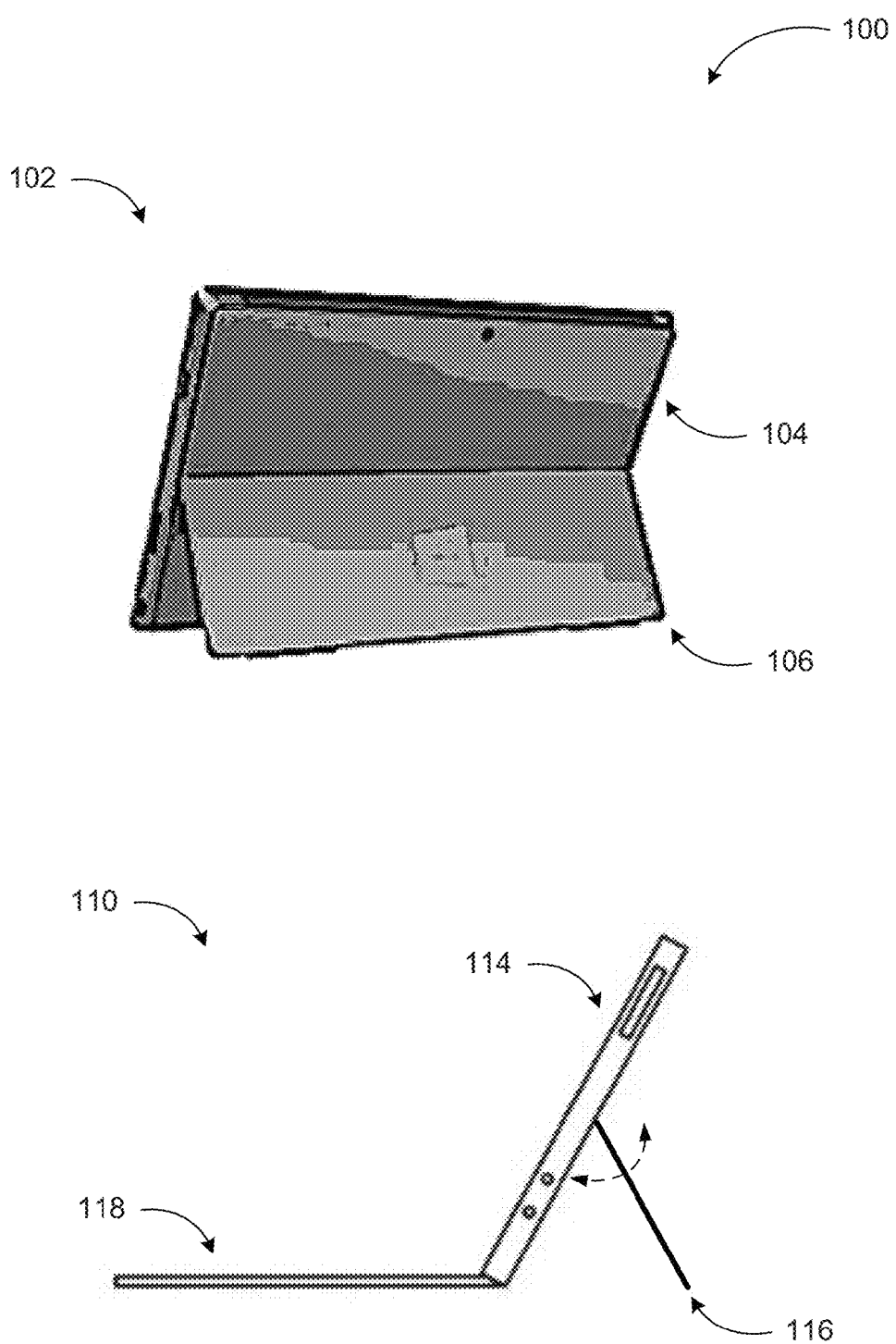
FIG. 1 illustrates two different views of a tablet computer with a kickstand.

FIG. 1 illustrates two different views of a tablet computer with a kickstand.

View 102 in diagram 100 shows a tablet form factor computer with a kickstand. The body 104 of the computer is substantially rectangular with the kickstand 106 being coupled to the body 104 along a lateral seam. To provide an aesthetically pleasing integration, the coupling of the kickstand 106 and the body 104 may be a level connection, in which the hinge does protrude from the back surface plane of the body 104.

View 110 of diagram 100 is side view of a similar tablet computer along with a keyboard 118. The keyboard 118 may be connected to the body 114 of the computer along its bottom edge permanently or temporarily. The kickstand 116 may be rotatable at predetermined angles to enable setting of the tablet computer for various viewing angles.

The ability to set the screen angle may have a substantial influence on the user experience. In a system according to some implementations, increasing the number of discreet positions available or providing continuous adjustability within a desired range of rotation may enhance the user experience by making optimal screen angle available for more users in more situations. In other implementations, a friction hinge may provide the connection with the ability to provide 180 degrees of rotation of the kickstand 116 while maintaining a minimal gap between the kickstand 116 and the body 114. By using band friction technology, the friction hinge may be able to achieve sufficient torques to support use and abuse loads and to maintain these loads over the lifecycle of the computer.

Figure 2:
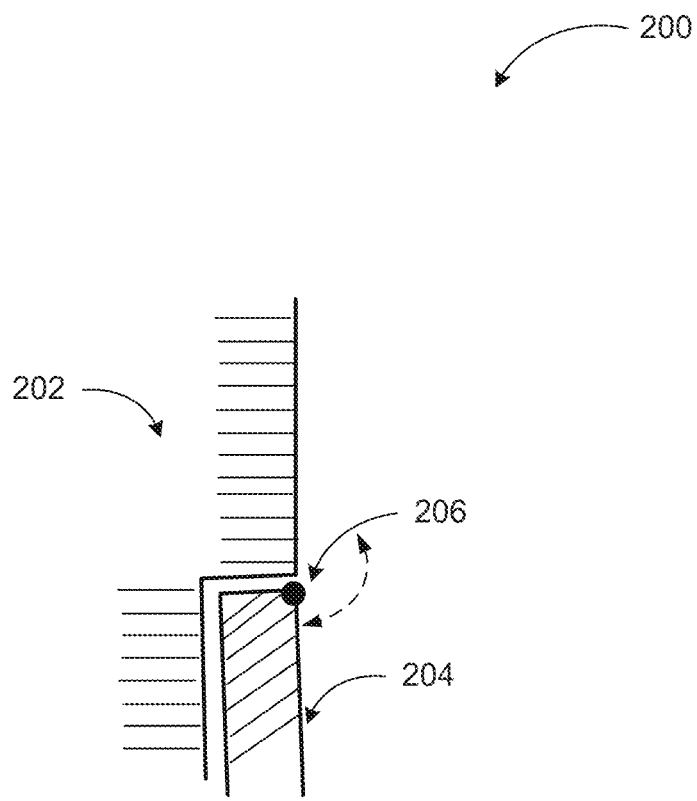
FIG. 2 illustrates a close-up view of the kickstand—tablet computer connection.

FIG. 2 illustrates a close-up view of the kickstand—tablet computer connection.

According to the example implementation shown in diagram 200, a pivot point 206 of the kickstand body coupling enables 180 degree rotation while maintaining a substantially constant y-gap between the kickstand 204 and the body 202. A friction hinge may be able to provide the 180 degrees of rotation while maintaining a minimal gap. By using band friction technology the friction hinge may be able to achieve sufficient torques to support use and abuse loads and maintain these loads over the life of the product. Furthermore, the ability to go to 180 degrees may provide for overload handling without requiring additional mechanism or complexity (i.e., the kickstand may simply rotate to one extreme position when unexpected pressure is applied to the body).

FIG. 3A through 3E illustrate an example connection mechanism that includes friction coupling and telescoping linkage at different rotation angles.

In FIG. 3A through 3E, the telescoping link is shown coupled to the shaft. This is one illustrative example and does not imply a limitation on implementations. The telescoping link may also be coupled to a friction core, which may be a friction band, a friction disk, or a friction clip. The band friction and the clip friction may be similar in that they both apply pressure circumferentially wrapped around the shaft. Disc friction may apply friction axially in a circle about the shaft. Thus, disk friction may have slightly less torque density, but may add additional programmability to the torque curve. In case of disc friction, the friction may be around a shaft, but the force is applied in the axial direction. Furthermore, the friction core may be singular, or (frequently) bands, clips, and discs may be employed in multiples at a time.

Figure 3A:
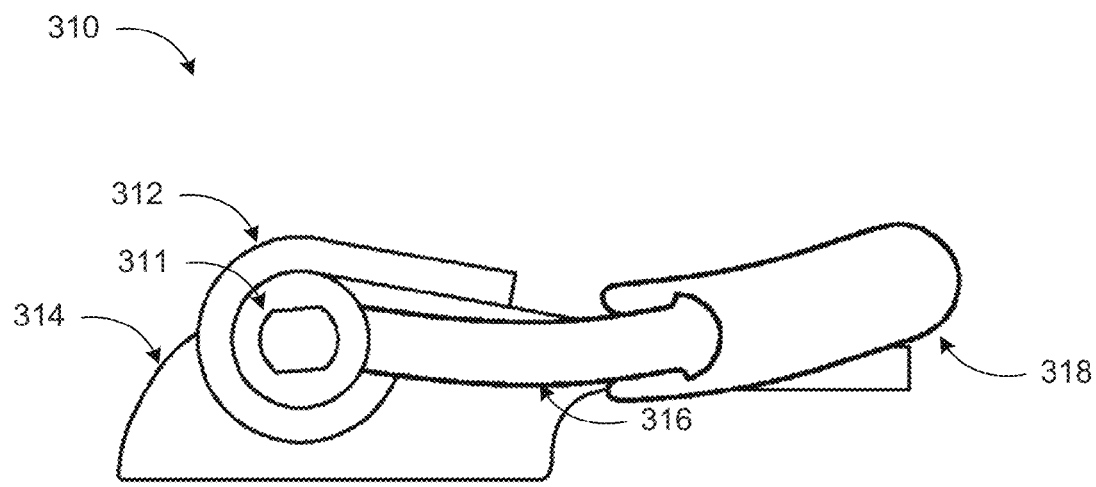
FIG. 3A through 3E illustrate an example connection mechanism that includes friction coupling and telescoping linkage at different rotation angles.

Diagram 310 in FIG. 3A shows the components of a band/shaft coupling that may be employed in some implementations. A telescoping link 316 may be coupled to a friction core. The friction core may include a friction band 312, a friction disk, or a friction clip. The rotational friction torque is provided by the shall 311 and the friction band 312 substantially surrounding the shaft 311. The telescoping link 316 attached to the shaft 311 and partially enclosed by the anchor link 318 may enable friction coupling on a secondary axis. The band 312 may be fastened to kickstand link 314.

Maintenance of a substantially constant gap between the kickstand and the body at all hinge angles, support for usage loads, support for maximum rotation (180 degrees), low force opening to a first position, and/or support for accidental overload may be achieved through the use of the friction coupling on a secondary axis to induce a pure moment to the kickstand at all kickstand angles. In order to constrain the friction, the telescoping linkage may react against the moment and couple the friction element to mechanical ground.

Figure 3B:
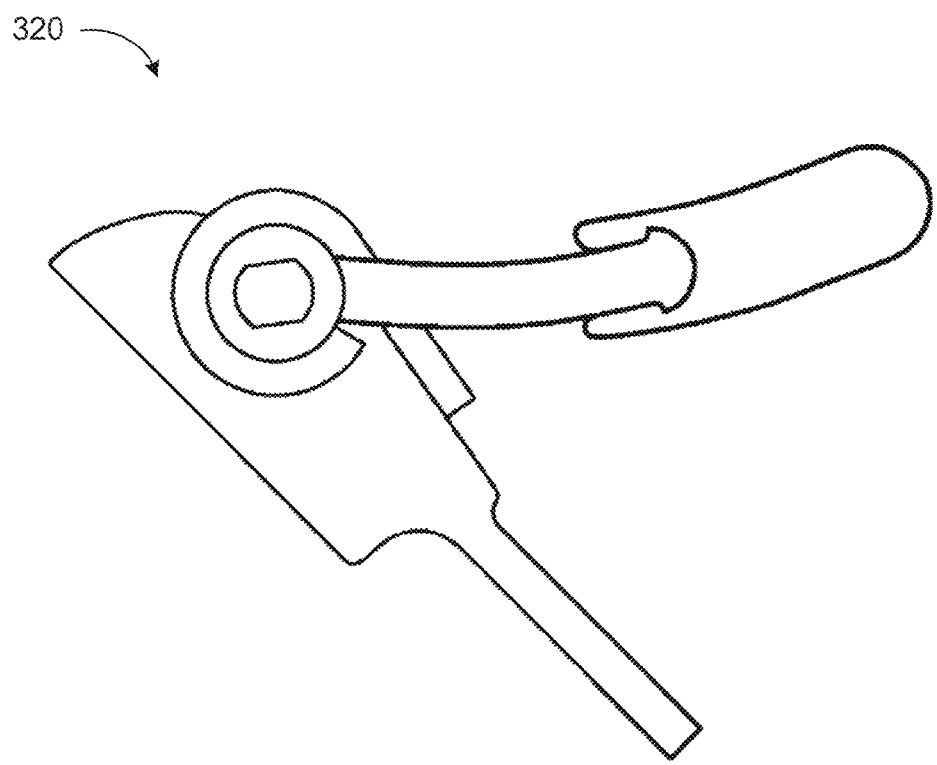

Diagram 320 of FIG. 3B shows the friction coupling hinge configuration of diagram 310 at a different rotation angle. The band/shaft combination may be formed using metal injection molding ("MIM") technology. MIM technology may allow for small feature creation, which in turn may allow for different cam profiles (for example, for weight matching) that may otherwise not be available in band or clip friction approaches. Furthermore, with MIM technology, high strength steels may be molded, which may allow for a higher torque density (or smaller parts) and may be less constrained by manufacturing processes (as band and clip friction are subject to sheet metal and other processing limitations). The MIM material may also allow for managing the band shape such that the material is optimized for maximum strain energy throughout the part thereby achieving the maximum torque density.

In a MIM part, it may be difficult to balance strength with ductility. That is, when the part is ductile enough to have good fracture resistance, the material may be too soft and may wear rapidly. When the part is hard enough to resist wear, it may be subject to fracture. The wear resistance may be decoupled from the ductility according to some implementations by incorporating a wear plate (discussed in FIG. 3E below) in the band that may be very hard (for example, HRC50+) and that manages the wear of the parts. The band may be reduced to HRC35, for example, in order to have enough ductility to resist fracture.

Figure 3C:
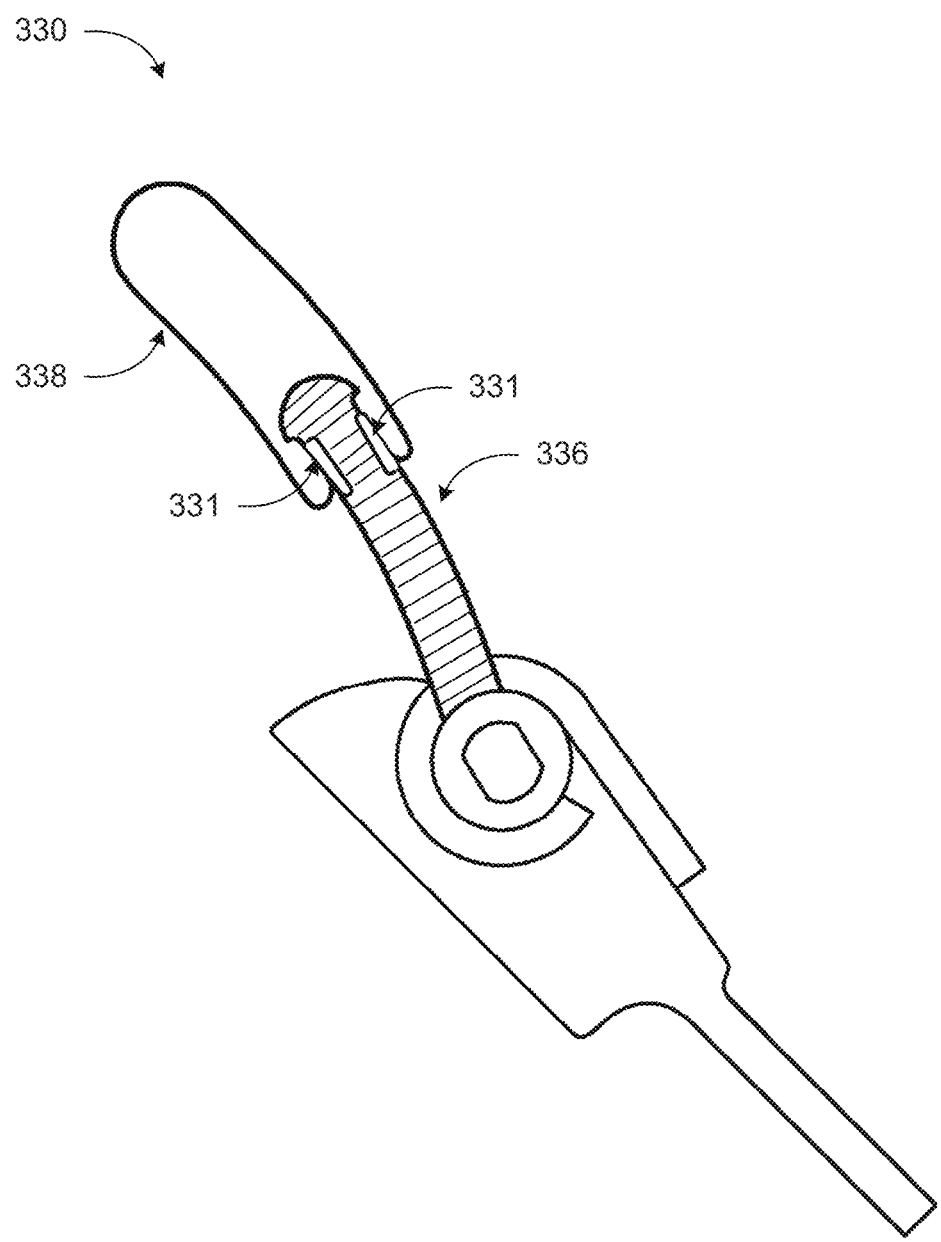

Diagram 330 of FIG. 3C is an illustration of additional capabilities that may be introduced using a telescopic linkage-band/shaft coupling combination according to some implementations. For example, notches 331 near an end of the telescoping link 336 may provide small free play space. At the beginning of the rotation (e.g., 5-10 degrees) of the kickstand, the user may not experience the torque due to the notches as the telescoping link is pushed into the anchor link 338 allowing the user to insert his or her finger between the kickstand and the body easily.

Figure 3D:
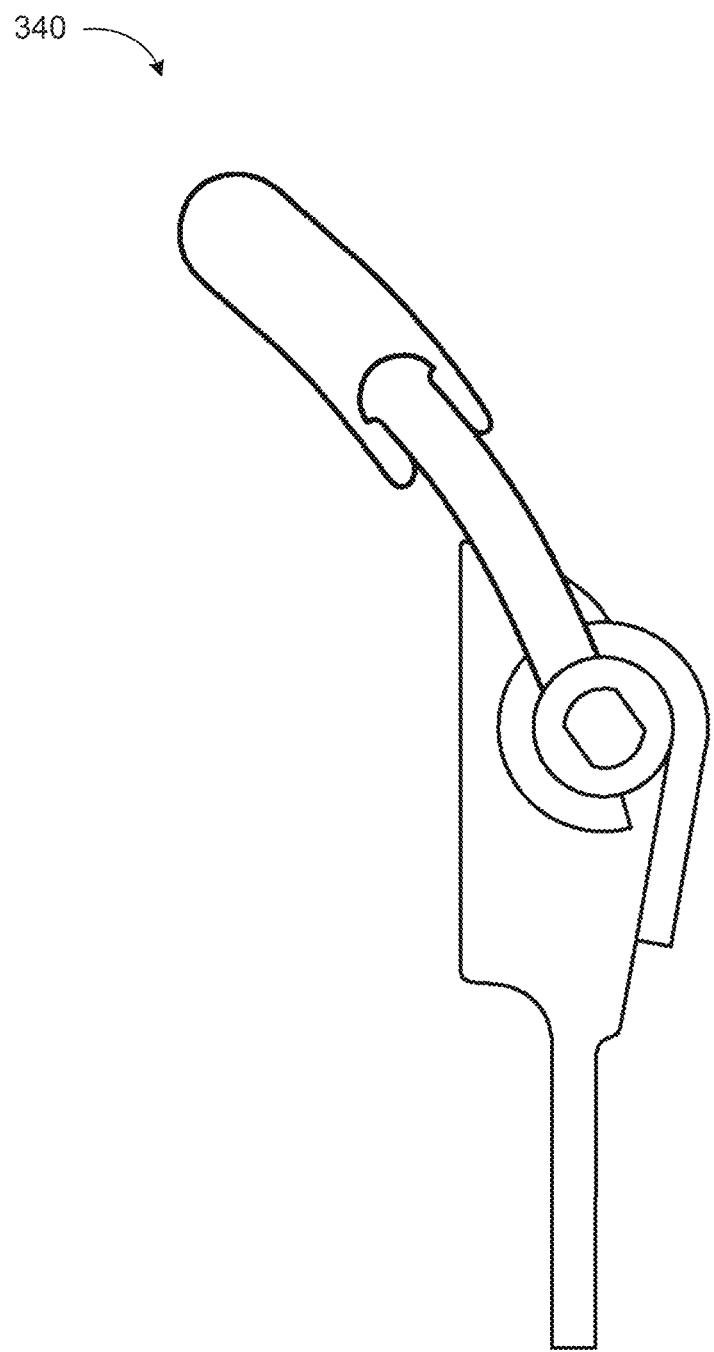

Diagram 340 of FIG. 3D is yet another rotation angle view of the friction coupling hinge configuration of diagram 310. In further implementations, additional friction may be introduced in the telescopic linkage by selecting suitable materials, dimensions, or using additional materials (e.g., lining the inside of the anchor link with a higher friction material). The total friction of the system is the sum of the friction of its components. Thus, the friction needed at the band/shaft coupling may be reduced by introducing the additional friction at the telescopic linkage. In other implementations, the friction in other components of the system may be reduced such that the friction of the band/shaft coupling is the dominant source of friction, and consistency over the lifetime of the hinge can be achieved.

Figure 3E:
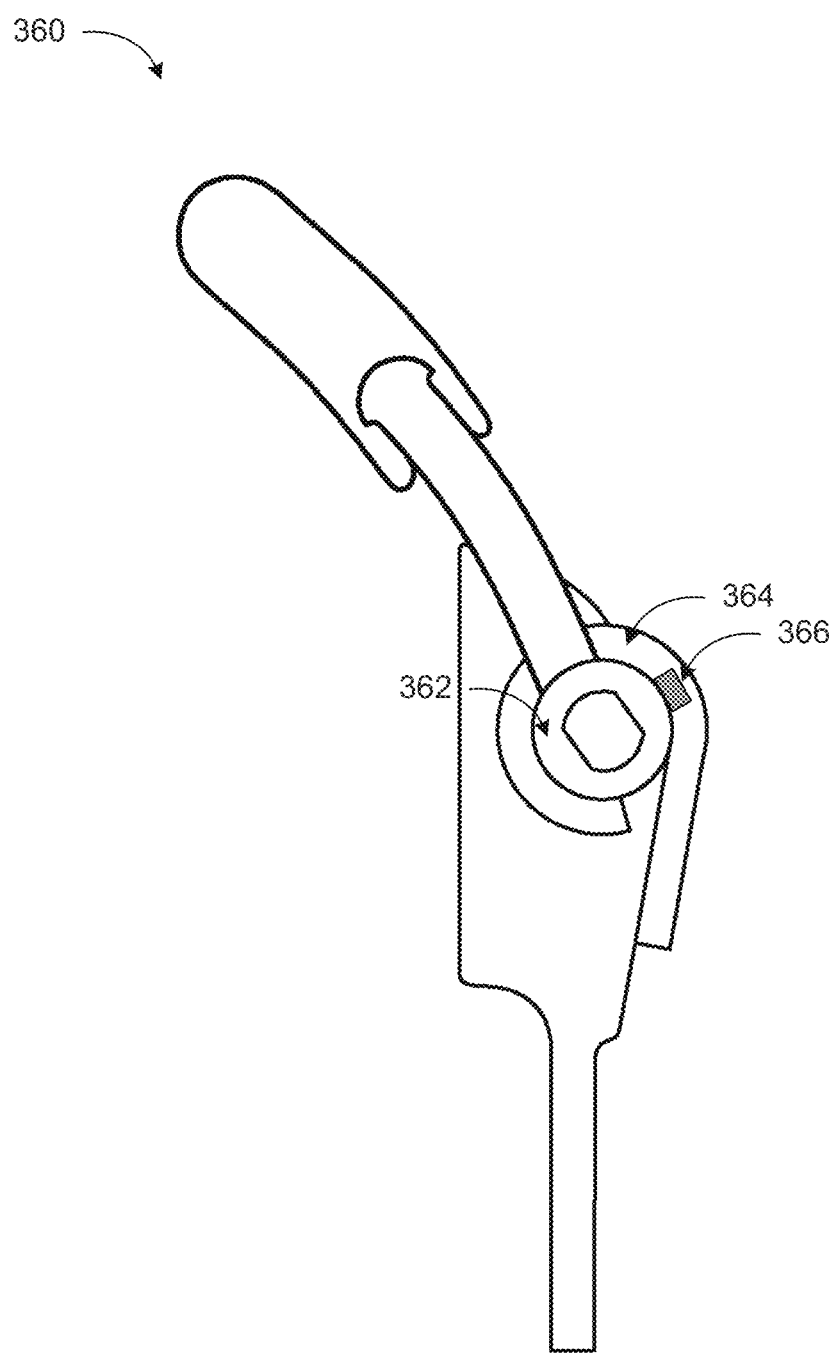

Diagram 360 of FIG. 3E shows a wear plate 366 incorporated into the band/shaft structure comprising band 364 and shaft 362. As discussed above, the wear resistance may be decoupled from the ductility according to some implementations by incorporating the wear plate 366 that manages the wear of the parts. The wear plate may be held in place by the insertion of the shaft 362. A close-fit coupling, a dovetail joint, or similar coupling mechanisms may be employed to hold the wear plate 366 in place. The wear plate 366 may also be held in by an interference fit, glue, welding, etc.

Figure 4:
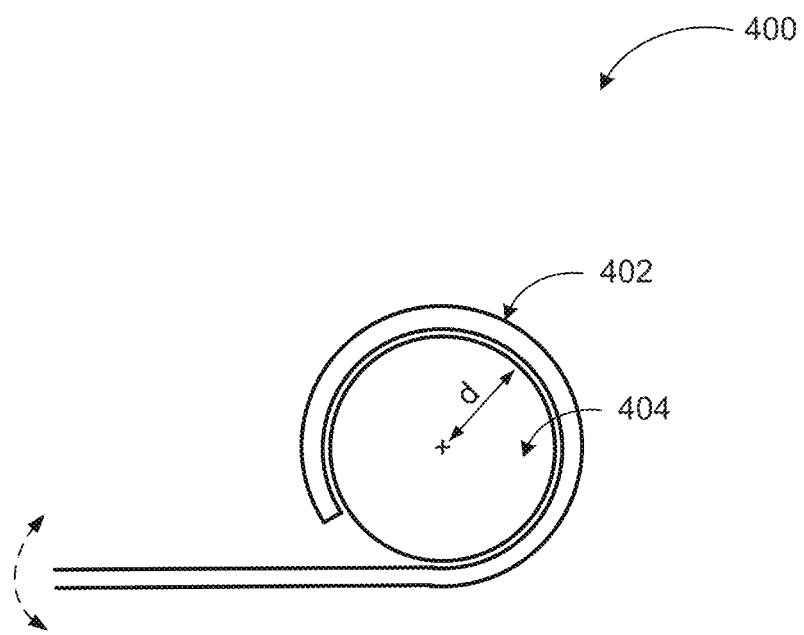
FIG. 4 illustrates an example band/shaft coupling.

FIG. 4 illustrates an example band/shaft coupling.

Diagram 400 shows a basic, circular band/shaft coupling with a shaft 404 of diameter d and a band 402 (e.g., the friction band 312) substantially surrounding the shaft 404. In other examples, the band 402 (e.g., the friction band 312) may be replaced with a friction disk 402 substantially surrounding the shaft 404. In sheet metal based systems, torque density is limited to twice the thickness of the material for a given diameter of the shaft 404. Thus, thinner tablet computers may not be able to be designed with desired torque density using, circular, sheet metal based band/shaft coupling. A system according to some implementations may be able to provide desired torque density and other design aspects discussed above by using the telescopic linkage and non-circular shaft profiles.

FIG. 5A through 5D illustrate various examples of a metal-injection-molding band/shaft coupling that may be used for different implementations.

Figures 5A, 5B:
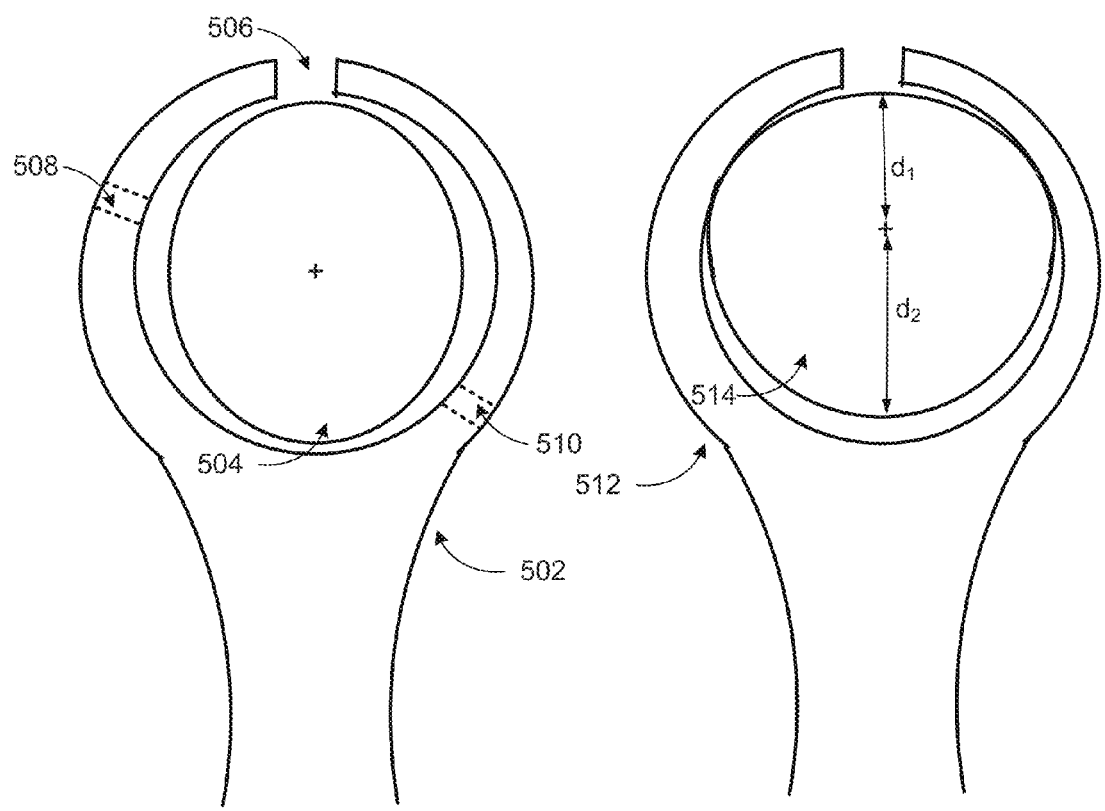
FIG. 5A through 5D illustrate various examples of a metal-injection-molding (MIM) band/shaft coupling that may be used for different implementations.
Figure 5C:
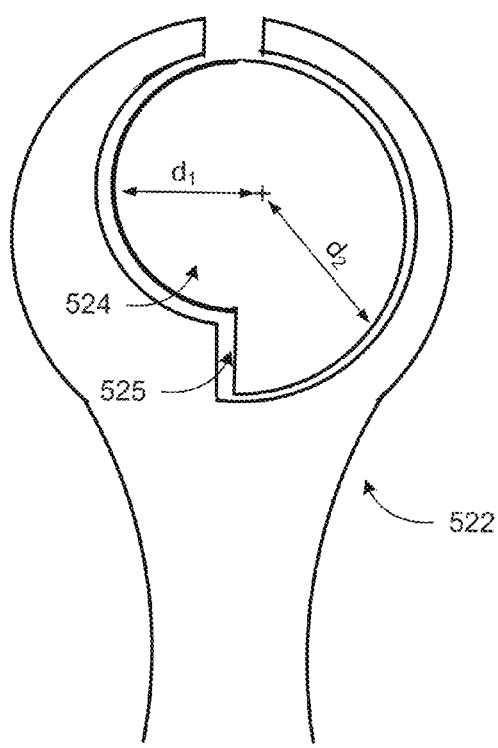

The example band/shaft coupling in FIG. 5A includes a substantially elliptical shaft 405 as opposed a circular one providing an increasing torque profile as the arms of the band 502 (e.g., the friction band 312) are pushed apart differently while the shaft is rotating. In examples, the band 504 (e.g., the friction band 312) may be replaced with a friction clip 502. The gap 506 between the arms of the band 502 may also be placed at different locations (e.g., location 508 or 510) selecting the location of a dip in the torque curve, thereby determining at which rotation angles the user can move the kickstand with little or no force. It should be noted that this example hinge may have a band that does not have an opening It may have a continuous hoop and the compliance may be created by the spaces between the elliptical shaft and the circular band. The shape may be designed such that the shaft may have circular arcs that match the band shape at the friction interface and the sides of the shaft profile that do not touch the shaft may be designed to optimize the compliance and the contact surface.

The shaft 514 in FIG. 5B has a profile that is essentially a combination of two concentric circles (diameters d1 and d2). The concentric circles may define a cam profile where the radii are selected to set the torque in a particular angular region. This may require a complimentary (not matching) geometry in the band. In some implementations, a flat portion on the band may be used, which may allow the radii on the shaft to function properly. In other implementations, the cross-section of the band may be profiled to optimize the strain energy in the band. For example, eccentric circles may be used. Thus, the cross-section of the band may be tuned to optimize the use of the material to achieve the maximum strain energy out of the material and thereby the highest torque density. In some implementations of the concentric circles, the centers of the two circles may diverge. As the center diverge, the strain energy of the band 512 may be used more efficiently.

In yet other implementations, the cam curve may be made to match the weight profile of the kickstand. There may be a shape or "profile" for the friction band 312 and the shaft 311 in order to create the tuned or programmed torque profile. In other examples, there may be the shape or the profile for the friction clip and the shaft 311. In further examples, there may be the shape or the profile for the friction disk and the shaft. In some implementations, where the weight profile is matched, the profile may follow an equation for a line in polar coordinates, for example, R=mq+b; where R is the profile radius at a given q, m is the rate of change of the radius, and b is the initial radius. In another example implementation, the shaft 524 in FIG. 5C may have a combination profile. The first part may be a circle (substantially the left half of the shaft) with a constant radius d1, while the part may have a second radius d2. The part may be designed such that its radius changes from d1 to d2 by increasing linearly or non-linearly. In one alternative, the radius may increase abruptly from d1 to d2. A linear increase from d1 to d2 may provide an initially constant torque followed by an increasing torque profile because the increasing strain energy of the band 522 due to the increasing radius part of the shaft 524 pushes the band 522 apart. The drop component 525 may be used to define where the rotation ends.

Figure 5D:
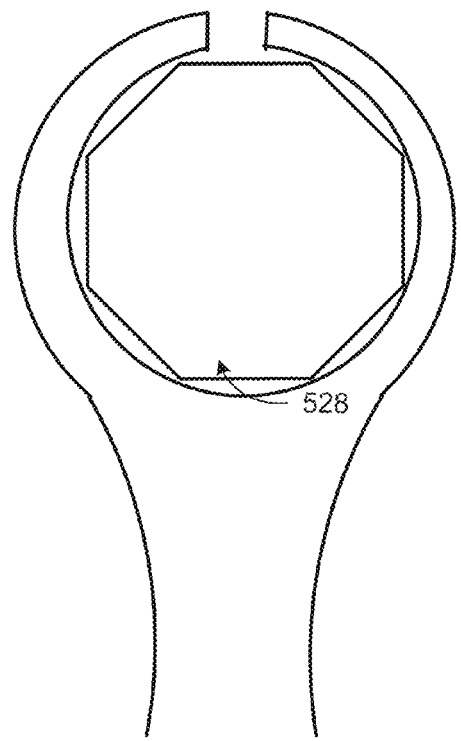

The example shaft 528 in FIG. 5D has a polygonal profile allowing the kickstand to have detent positions. By selecting the polygon (e.g., hexagon, octagon, etc.), a number of desired detent positions may be set. In yet other implementations, combinations of the above-discussed profiles and others may be used. For example, a polygonal profile may be combined with the constantly increasing radius profile resulting in a torque profile that increases from one detent position to another.

In yet further implementations, a break lever structure may be used in conjunction with the band/shaft structure allowing higher friction coefficient and higher torque when the kickstand is opening and lower torque when the kickstand is closing. In some implementations, a rubber brake pad may be used where one or more hinge components may be sandwiched between two flexible or semi-flexible pads, and the pads may be pressed against each other through an adjustable pressure mechanism (e.g., a screw) such that a friction coefficient may be set to a desired value.

The examples in FIG. 1 through 5 have been described with specific components, profiles, and configurations. Implementations are not limited to systems according to these example configurations. A friction hinge for tablet computers and similar devices may be implemented in configurations using other types of couplings using the principles described herein.

Figure 6:
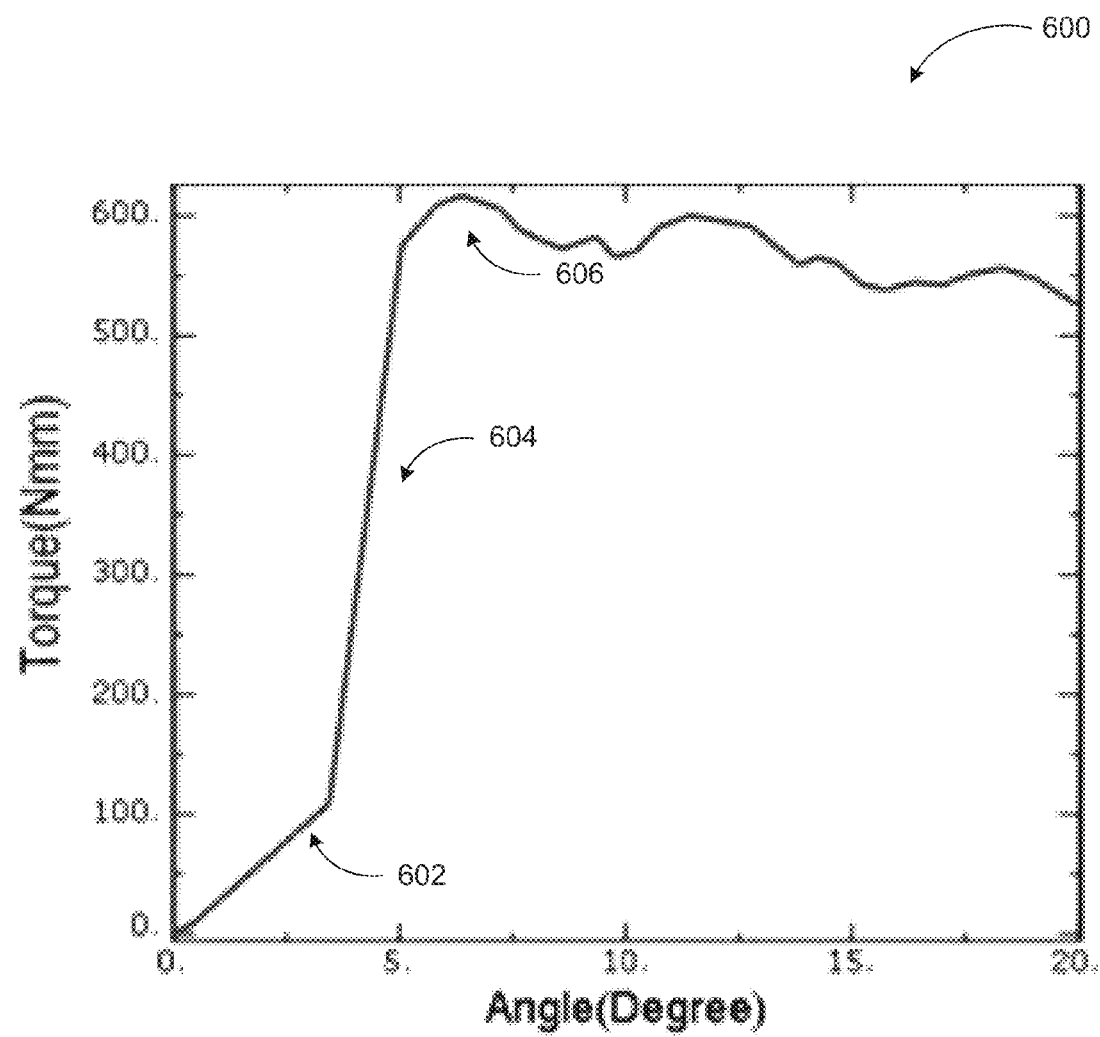
FIG. 6 illustrates an example torque—rotation angle curve of telescoping linkage.

FIG. 6 illustrates an example torque—rotation angle curve of telescoping linkage.

Diagram 600 shows the linear increase in torque (602) for the first few degrees of rotation, followed by a sharper linear increase (604) until a peak torque value is reached (606) and the torque remains substantially constant or drops slightly as the rotation continues. The challenge with this type of torque curve is that the user experiences a need to provide increasing force as they first open the kickstand even for the first few degrees. When the user first begins to open the kickstand, the user may not have a solid grip on the kickstand. A specially formed grip component, such as a ridge or handle, may alleviate this effect by prompting the user to firmly grip the kickstand upon initiating the opening of the kickstand.

Figure 7:
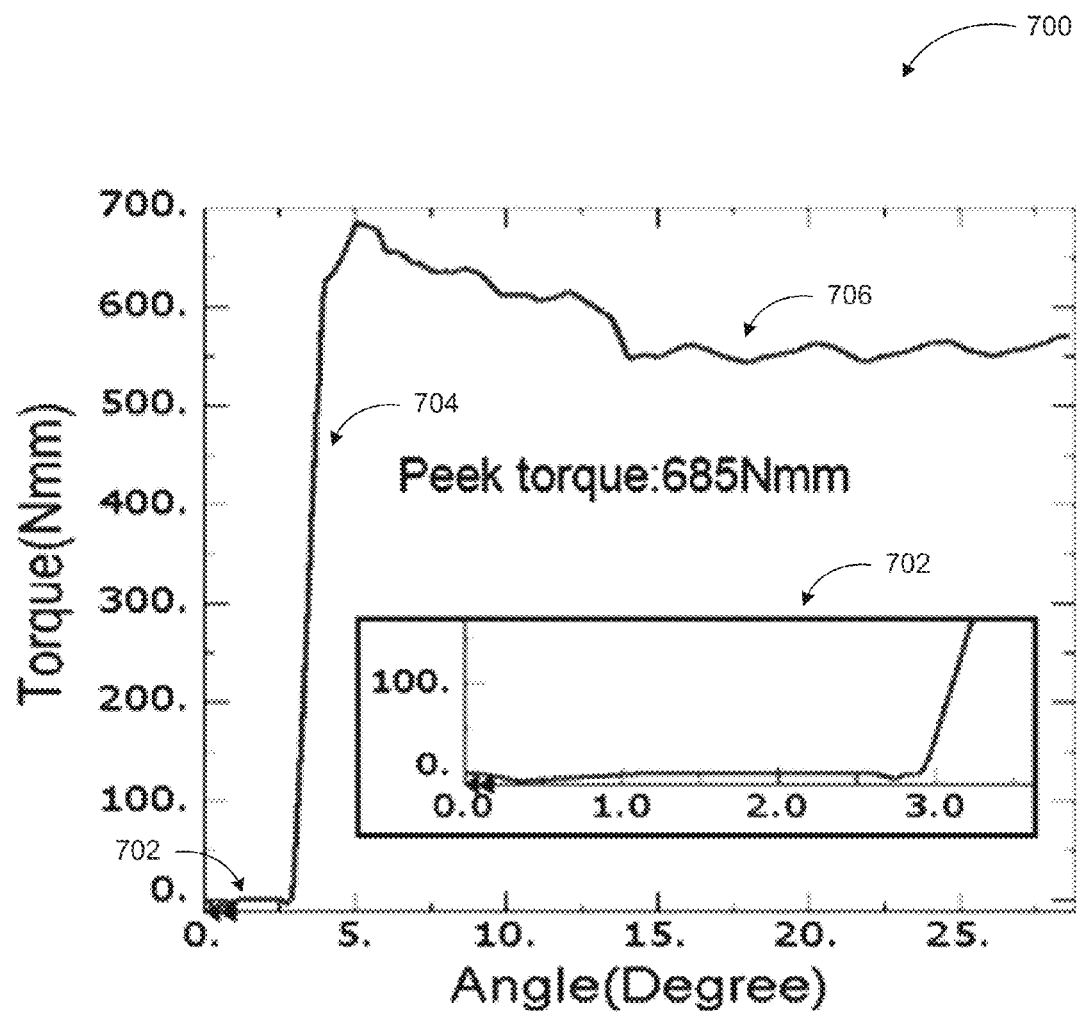
FIG. 7 illustrates an example torque—rotation angle curve of band/shaft coupling.

FIG. 7 illustrates an example torque—rotation angle curve of band/shaft coupling.

The torque curve of a band/shaft coupling in diagram 700 includes a substantially no torque zone (702) at the beginning of the rotation shown in detail in the close-up view. Thus, a kickstand with a torque curve similar to the one shown in diagram 700 may allow a user to open the kickstand without considerable force. For example, the user may only need to provide less than 5 Nmm of torque to open the kickstand. Following the low torque zone, a sharply increasing portion (704) of the torque curve may ensure a substantially constant torque 706 may be provided through the remainder of the rotation although a small peak may occur at the beginning.

Figure 8:
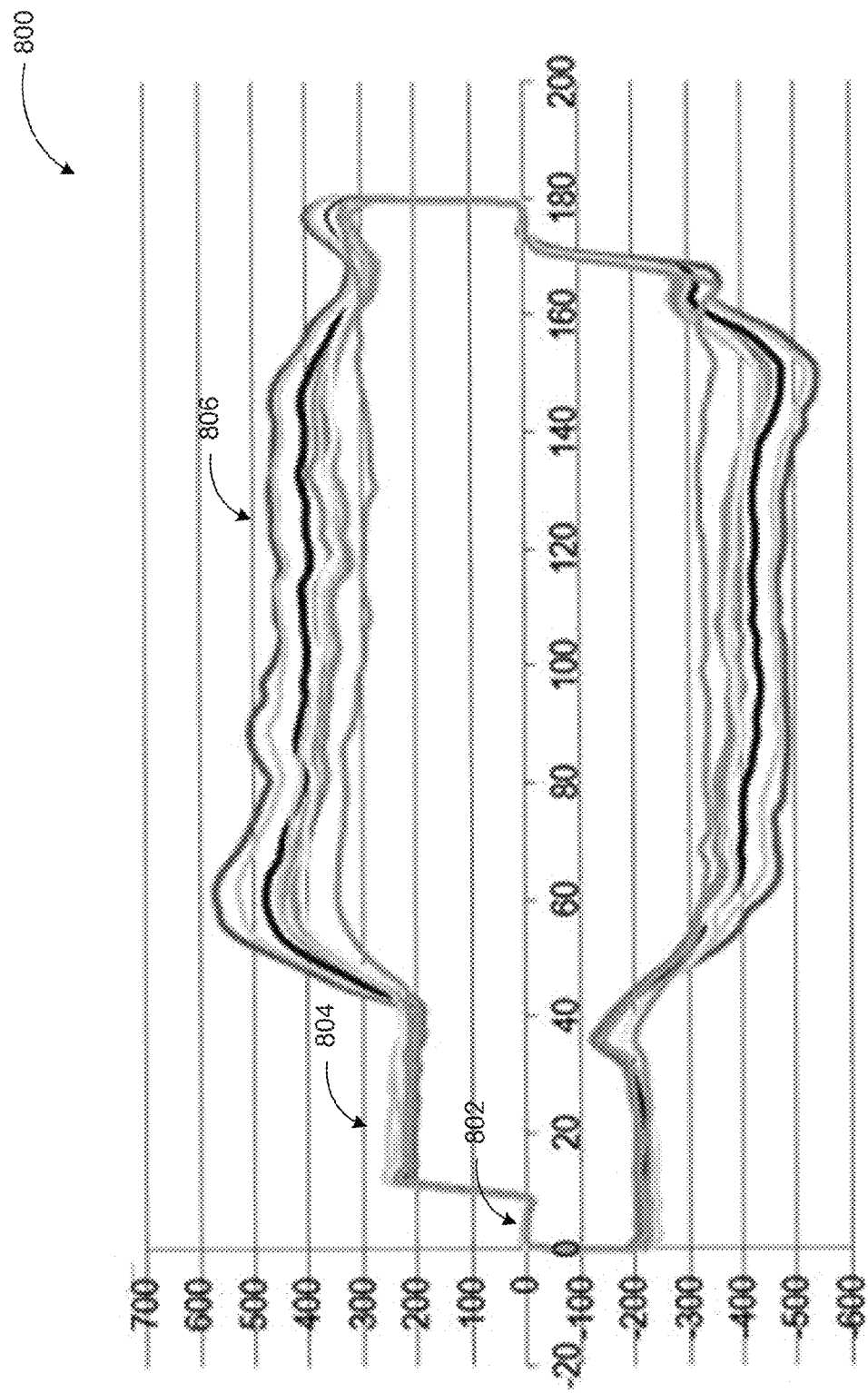
FIG. 8 illustrates example torque profiles for 2-stepped cam curve.

FIG. 8 illustrates example torque profiles for 2-stepped cam curve.

As discussed above in conjunction with FIG. 5D, various profile shafts or comparable structures may be employed to create detent positions and/or different torque profiles. Diagram 800 shows a 2-stepped torque curve, where the band/shaft coupling together with a telescopic linkage may enable three distinct torques to be experienced by the user as the kickstand is rotated. For the first few degrees (opening zone 802), substantially zero torque may be achieved through a mechanism such as the notches discussed above. This may be followed by the first substantially constant torque zone 804, which in turn may be followed by the second substantially constant torque zone 806.

The first substantially constant torque zone 804 may enable the user to open the kickstand easier for up to 45 degrees. The range of 0-45 degrees for the kickstand may cover the typical positions for the kickstand when the user wants the display of the tablet computer in an upright position. After the typical positions, more torque may be applied to prevent accidental opening of the kickstand all the way (e.g., opening to 180 degrees). The user may wish to open the kickstand to, for example, 140 degrees to provide an obtuse angled surface that is optimized for writing on a tablet with a stylus or other input device. Requiring more torque to open the kickstand past 140 degrees may advantageously prevent the kickstand from opening further when the user applies a downward force on the tablet as he or she writes on the tablet surface. An increased torque profile at a second or third stages may be use to indicate to the user that the typical usage zone has been exceeded. Yet, in other implementations, the torque presented for higher degrees of rotation may be less than the torque for the initial zone (e.g., first 45 degrees) because the user may expect to apply lesser force for higher degrees of rotation.

In yet other implementations, an asymmetric torque profile may be provided where less torque may be presented for closing the kickstand compared to opening. Thus, the user may be able to close the kickstand with less force than when opening it.

According to some example implementations, a friction hinge is described that includes a band/shaft structure with a friction shaft and a friction band that is configured to substantially surround the friction shaft; and a telescoping linkage structure that includes a telescoping link attached to the friction shaft and an anchor link that is configured to at least partially surround the telescoping link.

The friction band may be configured to be attached to a component and the anchor link may be configured to be attached to another component, the friction hinge enabling rotational coupling between the component and the other component while maintaining a substantially constant gap between the component and the other component during rotation. The friction hinge may also include one or more notches formed near an end of the telescoping link such that a substantially zero torque is provided during an initial portion of the rotation of the component and the other component. The telescoping link and the anchor link may be selected to provide additional friction for the friction hinge.

The additional friction may be provided through one or more of a selection of dimensions of the telescoping link and the anchor link, a selection of materials for the telescoping link and the anchor link, and an application of friction controllable material to a surface of at least one of the telescoping link and the anchor link. The additional friction may be minimized such that the friction provided by the band/shaft structure is dominant or selected to complement the friction provided by the band/shaft structure.

A profile of the friction shaft may be selected such that a weight profile of the component is substantially matched. A profile of the friction shaft may be selected such that an asymmetric torque profile is provided with less torque being presented as the component and the other component are rotated toward each other compared to a torque being presented as the component and the other component are rotated away from each other. The band/shaft structure may be formed using metal injection molding (MIM).

According to other example implementations, a friction hinge for coupling a kickstand and a computing device may include a band/shaft structure with a friction shaft and a friction band that is configured to substantially surround the friction shaft; and a telescoping linkage structure that includes a telescoping link attached to the friction shaft and an anchor link that is configured to at least partially surround the telescoping link, where the friction band is configured to be attached to the kickstand and the anchor link is configured to be attached to a body of the computing device, the friction hinge enabling rotational coupling between the kickstand and the body while maintaining a substantially constant gap between the kickstand and the body during rotation of the kickstand.

The friction shaft may have a substantially elliptical profile. A location of a gap in the friction band may be selected based on a desired dip in a rotation angle-torque curve of the friction hinge. The friction hinge may further include a break lever structure configured to provide increased friction and an asymmetric torque as the kickstand opens and closes. The friction hinge may also include a brake pad structure configured to compress one or more components of the friction hinge through an adjustable pressure mechanism to provide increased torque as the kick stand is rotated. Shapes of the friction shaft and dimensions of the telescopic linkage structure may be selected to provide a multi-step torque profile across a rotation spectrum of the kickstand. For example, the structure may have a minor radius on the shaft and a flat surface in the band, although this may be accomplished with other band/shaft profiles. At angles where the minor radius is in contact with the flat surface, the torque may be lower because the band is less deflected. At angles where the major radius is against the flat, the torque may be higher because the band is more deflected.

According to further example implementations, a rotatable support structure for a tablet device may include a kickstand configured to support the tablet device at a plurality of angles; a band/shaft structure that includes a friction shaft and a friction band that is configured to substantially surround the friction shaft; and a telescoping linkage structure that includes a telescoping link attached to the friction shaft and an anchor link that is configured to at least partially surround the telescoping link, where the friction band is configured to be attached to the kickstand and the anchor link is configured to be attached to a body of the tablet device, the friction hinge enabling rotational coupling between the kickstand and the body while maintaining a substantially constant gap between the kickstand and the body during rotation of the kickstand.

The friction shaft may have a profile that includes two substantially concentric circles with distinct diameters, at least one of the diameters being selected based on a desired torque to be presented as the kickstand is rotated. The friction shaft may have a polygonal profile with a number of sides of the polygon are selected based on a number of detent positions for the kickstand. The friction shaft may also have a profile with a combination of a substantially constant diameter first circle and an increasing diameter second circle to provide a torque profile that includes a constant torque portion and an increasing torque portion across a rotation spectrum of the kickstand. The friction shaft may have a further profile that includes a combination of a substantially constant diameter first polygon and an increasing diameter second polygon to provide a torque profile that includes a constant torque portion and an increasing torque portion across a rotation spectrum of the kickstand with detent positions.

The above specification, examples and data provide a complete description of the manufacture and use of the composition of the embodiments. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims and embodiments.

What is claimed is:

1. A fiction hinge comprising:
   a friction shaft;
   a friction core that is configured to substantially surround the friction shaft,
      wherein the friction core includes one of a friction band, a friction clip, and a friction disk,
      wherein the friction band and the friction clip apply pressure circumferentially around the friction shaft,
      wherein the friction disk applies friction axially around the friction shaft, and
      wherein the one of the friction band, the friction clip, and the friction disk is configured to be attached to a first component;
   a telescoping link attached to one of the friction core and the friction shaft; and
   an anchor link configured to at least partially surround the telescoping link,
      wherein the anchor link is configured to be attached to as second component and the friction hinge is configured to enable rotational coupling between the first and the second components while maintaining a substantially constant gap between the first and the second components during rotation.

2. The friction hinge of claim 1, further comprising one or more notches formed near an end of the telescoping link such that a substantially zero torque is provided during an initial portion of the rotation of the first and the second components.

3. The fiction hinge of claim 1, wherein the telescoping link and the anchor link are selected to provide additional friction for the friction hinge.

4. The friction hinge of claim 3, wherein the additional friction is provided through one or more of a selection of dimensions of the telescoping link and the anchor link, a selection of materials for the telescoping link and the anchor link, and an application of friction controllable material to a surface of at least one of the telescoping link and the anchor link.

5. The friction hinge of claim 1, wherein a shape of the friction core is selected such that one of a tuned torque profile and a programmed torque profile is created.

6. The friction hinge of claim 1, wherein a shape of the friction core is selected such that an asymmetric torque profile is provided, with less torque being presented as the first and the second component are rotated toward each other compared to a torque being presented as the first and the second component are rotated away from each other.

7. The friction hinge of claim 1, wherein the friction core is formed using metal injection molding (MIM).

8. A friction hinge for coupling a kickstand and a computing device, the friction hinge comprising:
   a friction shaft;
   a friction band that is configured to substantially surround the friction shaft,
      wherein the friction band is configured to be attached to the kickstand;
   a telescoping link attached to one of the friction shaft and the friction band; and
   an anchor link configured to at least partially surround the telescoping link,
      wherein the anchor link is configured to be attached to a body of the computing device, the friction hinge enabling rotational coupling between the kickstand and the body while maintaining a substantially constant gap between the kickstand and the body during rotation of the kickstand.

9. The friction hinge of claim 8, wherein the friction shaft has a substantially elliptical profile and the friction band is a continuous circular band such that compliance is created by spaces between a substantially elliptical friction shaft and the continuous circular band.

10. The friction hinge of claim 8, wherein a location of a gap in the friction band is selected based on a desired dip in a rotation angle—torque curve of the friction hinge.

11. The friction hinge of claim 8, further comprising a brake lever configured to provide increased friction and an asymmetric torque as the kickstand opens and closes.

12. The friction hinge of claim 8, further comprising a brake pad configured to compress one or more components of the friction hinge through an adjustable pressure mechanism to provide increased torque as a kick stand is rotated.

13. The friction hinge of claim 8, wherein a shape of the friction shaft and the friction band are selected to provide a multi-step torque profile across a rotation spectrum of the kickstand.

14. A rotatable support structure comprising:
   a kickstand;
   a friction shaft;
   a friction band configured to substantially surround the friction shaft, wherein the friction band is configured to be attached to the kickstand;
   a telescoping link attached to one of the friction shaft and the friction band; and
   an anchor link and configured to at least partially surround the telescoping link, wherein the anchor link is configured to he attached to an enclosure, the rotatable support structure enabling rotational coupling between the kickstand and the enclosure while maintaining a substantially constant gap between the kickstand and the enclosure during rotation of the kickstand.

15. The rotatable support structure of claim 14, wherein the friction shaft has a profile comprising of two substantially concentric circles with distinct diameters, at least one of the diameters being selected based on a desired torque to be presented as the kickstand is rotated.

16. The rotatable support structure of claim 14, wherein the friction shaft and the friction band have a profile with a number of local minima, the number of local minima selected based on a number of detent positions for the kickstand.

17. The rotatable support structure of claim 14, wherein the friction shaft and the friction band have a profile comprising a combination of a substantially constant diameter first circle and an increasing diameter second circle to provide a torque profile that includes a constant torque portion and an increasing torque portion across a rotation spectrum of the kickstand.

18. The rotatable support structure of claim 14, wherein the friction shaft and the friction band have a profile comprising a combination of a substantially constant diameter first polygon and an increasing diameter second polygon to provide a torque profile that includes a constant torque portion and an increasing torque portion across a rotation spectrum of the kickstand with detent positions.

* * * * *